United States Patent
Yamamoto et al.

(10) Patent No.: US 7,033,918 B2
(45) Date of Patent: Apr. 25, 2006

(54) SEMICONDUCTOR DEVICE INCLUDING P-CHANNEL TYPE TRANSISTOR, AND PRODUCTION METHOD FOR MANUFACTURING SUCH SEMICONDUCTOR DEVICE

(75) Inventors: Ichiro Yamamoto, Kanagawa (JP); Naohiko Kimizuka, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 168 days.

(21) Appl. No.: 10/749,915

(22) Filed: Dec. 31, 2003

(65) Prior Publication Data

US 2004/0155265 A1 Aug. 12, 2004

(30) Foreign Application Priority Data

Jan. 30, 2003 (JP) .................................. 2003-022764
Dec. 15, 2003 (JP) .................................. 2003-416411

(51) Int. Cl.
*H01L 21/3205* (2006.01)
*H01L 21/4763* (2006.01)

(52) U.S. Cl. ............................ 438/585; 438/592

(58) Field of Classification Search ............. 438/142, 438/197, 199, 585, 592, 595
See application file for complete search history.

(56) References Cited

U.S. PATENT DOCUMENTS

| | | | | |
|---|---|---|---|---|
| 6,589,827 B1 * | 7/2003 | Kubo et al. | ............... | 438/157 |
| 6,710,382 B1 * | 3/2004 | Kubo et al. | ............... | 257/250 |
| 6,710,407 B1 * | 3/2004 | Yamamoto | ............... | 257/344 |
| 6,780,741 B1 * | 8/2004 | Chen et al. | ............... | 438/592 |
| 2004/0067631 A1 * | 4/2004 | Bu et al. | ............... | 438/592 |
| 2005/0073014 A1 * | 4/2005 | Chan et al. | ............... | 257/410 |

FOREIGN PATENT DOCUMENTS

| | | |
|---|---|---|
| JP | 2001-284283 | 10/2001 |
| JP | 2002-043566 | 2/2002 |
| JP | 2002-305256 | 10/2002 |

* cited by examiner

*Primary Examiner*—Ha Tran Nguyen
*Assistant Examiner*—Scott B. Geyer
(74) *Attorney, Agent, or Firm*—Katten Muchin Rosenman LLP

(57) ABSTRACT

In a semiconductor device including at least one p-channel type MOS transistor, a silicon dioxide layer is formed on a silicon substrate, and a gate electrode is formed on the silicon dioxide layer. The gate electrode silicon has a three-layered structure including a silicon-seed layer formed on the silicon dioxide layer, a silicon/germanium layer formed on the silicon-seed layer, and a polycrystalline silicon layer on the silicon/germanium layer. An average grain size of polycrystalline silicon in the polycrystalline silicon layer is at most 100 nm, and p-type impurities are substantially uniformly distributed in the gate electrode along a height thereof, and the germanium atoms are diffused from the silicon/germanium layer into the silicon-seed layer at high density.

7 Claims, 7 Drawing Sheets

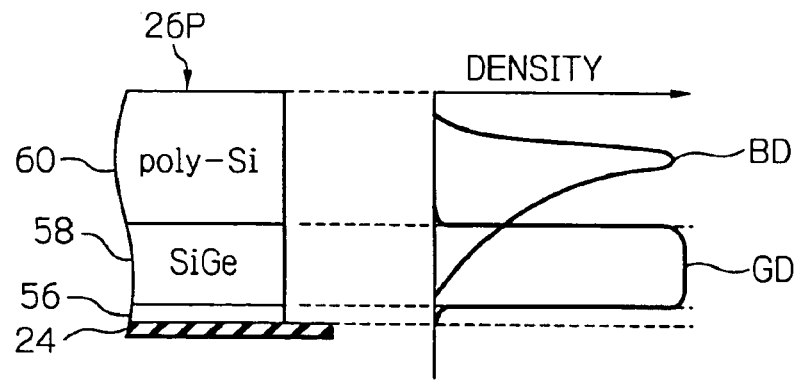
Fig. 5A
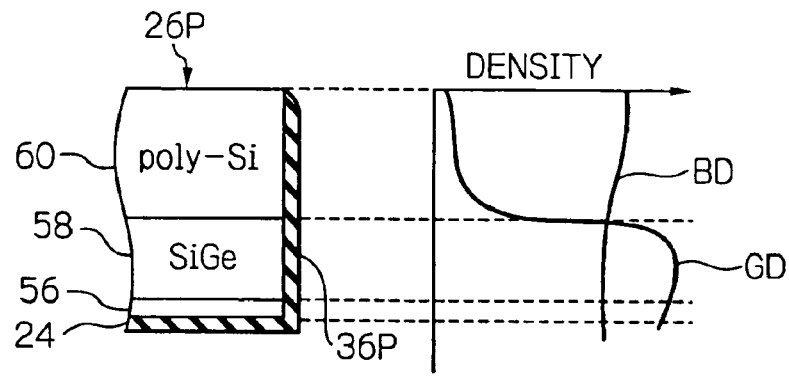
Fig. 5B
Fig. 6
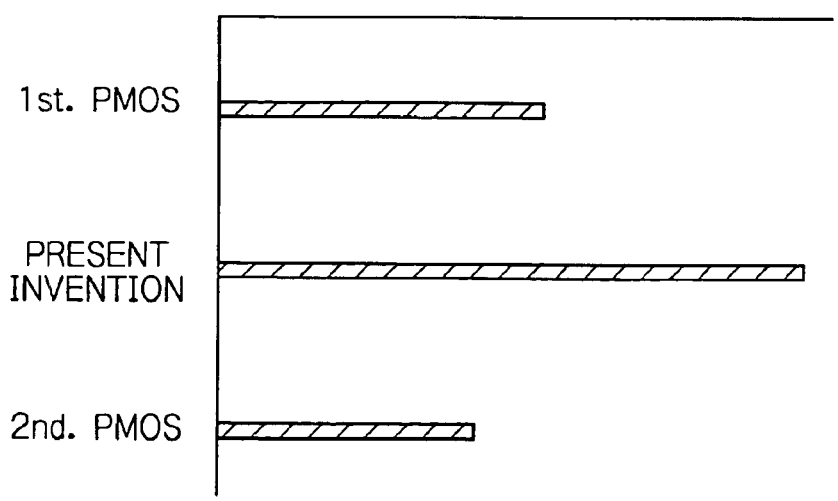

SEMICONDUCTOR DEVICE INCLUDING P-CHANNEL TYPE TRANSISTOR, AND PRODUCTION METHOD FOR MANUFACTURING SUCH SEMICONDUCTOR DEVICE

BACKGROUND OF THE INVENTION

1. Field of the Invention

The present invention relates to a semiconductor device including at least one p-channel type MOS transistor having a multi-layered gate electrode, an uppermost layer of which is composed of polycrystalline silicon, and a production method for manufacturing such a semiconductor device.

2. Description of the Related Art

For example, a complementary MOS device is known as a semiconductor device including at least one p-channel type MOS transistor. Namely, the complementary MOS device is constructed by a p-channel type MOS transistor and an n-channel type MOS transistor, which are usually formed on a silicon wafer so as to be associated with each other. As well known, in general, in the aforesaid MOS transistors, a gate electrode is composed of polycrystalline silicon, and is formed on a gate insulating layer composed of silicon dioxide. With the recent advance of miniaturization of complementary MOS devices, the size of the gate electrode has become smaller, and the thickness of the gate insulating layer has become thinner. Thus, it is necessary to validly suppress a short-channel effect, which may be caused in the miniaturized gate electrode.

Conventionally, for the suppression of the short-channel effect in the miniaturized gate electrode, p-type impurities, such as boron ions ($B^+$) or the like, are implanted in the gate electrode of the p-channel type MOS transistor, and n-type impurities, such as arsenic ions ($As^+$), phosphorus ions ($P^+$) or the like, are implanted in the gate electrode of the n-channel type MOS transistor.

Usually, the implantation of the p-type impurities in the gate electrode of the p-channel type MOS transistor is simultaneously achieved when the p-type impurities are implanted in a source-formation region and a drain-formation region of the p-channel type MOS transistor. Similarly, the implantation of the n-type impurities in the gate electrode of the n-channel type MOS transistor is simultaneously achieved when the n-type impurities are implanted in a source-formation region and a drain-formation region of the n-channel type MOS transistor.

Thereafter, an annealing process is carried out at a temperature of more than 1,000° C. so that the p-type impurities implanted in the source-formation and drain-formation regions of the p-channel type MOS transistor are activated so as to occupy sites in the silicon lattice, whereby the respective source-formation and drain-formation regions of the p-channel type MOS transistor are produced as a p-type source region and a p-type drain region. Similarly, by the annealing process, the n-type impurities implanted in the source-formation and drain-formation regions of the n-channel type MOS transistor are activated so as to occupy sites in the silicon lattice, whereby the source-formation and drain-formation regions of the n-channel type MOS transistor are produced as an n-type source region and an n-type drain region.

On the other hand, during the annealing process, the p-type impurities implanted in the gate electrode of the p-channel type MOS transistor are also activated so as to occupy sites in the silicon lattice, to thereby create holes in the gate electrode. Similarly, the n-type impurities implanted in the gate electrode of the n-channel type MOS transistor are activated so as to occupy sites in the silicon lattice, to thereby create electrons in the gate electrode. However, in each of the gate electrodes, all the implanted impurities are not necessarily activated by the annealing process. Namely, a ratio of the activated impurities to all the implanted boron ions is defined as an activation ratio.

As well known, the activation ratio in the gate electrode of a p-channel type MOS transistor is inferior to the activation ratio in the gate electrode of an n-channel type MOS transistor. Thus, in the p-channel type MOS transistor, a depletion layer is liable to be created in the vicinity of the interface between the gate electrode and the gate insulating layer, resulting in deterioration of performance of the p-channel type MOS transistor.

It is possible to carry out the annealing process such that the p-type impurities implanted in the gate electrode of the p-channel type MOS transistor can be sufficiently activated, but this manner is unacceptable, because the p-type and n-type impurities are excessively activated in the p-type and n-type source regions and the p-type and n-type drain regions, so that it is impossible to obtain each of the source regions and drain regions as a shallow region.

In order to resolve this problem, JP-A-2002-305256 proposes that germanium (Ge) be introduced into the gate electrode of the p-channel type MOS transistor such that the activation ratio of the p-type impurities can be enhanced in the gate electrode. In particular, the gate electrode of the p-channel type MOS transistor has a three-layered structure including a polycrystalline-silicon-seed layer formed on the gate insulating layer, a silicon germanium (SiGe) layer formed on the polycrystalline-silicon-seed layer, and an uppermost polycrystalline silicon layer formed on the SiGe layer. As disclosed in JP-A-2002-305256, the formation of polycrystalline-silicon-seed layer is carried out by using a chemical vapor deposition (CVD) method, under the conditions of an interior pressure of the atmosphere or several Torrs and an interior temperature falling in a range between 550° C. and 650° C., and the formation of the SiGe layer and the uppermost polycrystalline silicon layer are carried out under substantially the same conditions as the formation of the polycrystalline-silicon-seed layer.

When the formation of the uppermost polycrystalline silicon layer is carried out at a relatively low temperature (550 to 650° C.), grain sizes of polycrystalline silicon in the uppermost polycrystalline silicon layer may become larger while being annealed at the temperature of more than 1,000° C. When the grain sizes of polycrystalline silicon are too large, it is difficult to uniformly diffuse the implanted p-type impurities in the gate electrode along the height thereof, due to the large grain sizes of the polycrystalline silicon. Especially, the density of the p-type impurities is apt to be low in the vicinity of the interface between the polycrystalline-silicon-seed layer and the gate insulating layer, and thus it is difficult to effectively suppress the creation of the depletion layer in the vicinity of the aforesaid interface, resulting in deterioration of performance of the p-channel type MOS transistor.

SUMMARY OF THE INVENTION

Therefore, a main object of the present invention is to provide a semiconductor device including at least one p-channel type MOS transistor having a multi-layered gate electrode, an uppermost layer of which is composed of polycrystalline silicon, wherein the uppermost layer is constituted such that p-type impurities implanted in the gate electrode can be substantially uniformly diffused in the gate electrode along the height thereof.

Another object of the present invention is to provide a production method for producing such a semiconductor device.

In accordance with an aspect of the present invention, there is provided a semiconductor device including at least one p-channel type MOS transistor, which comprises a semiconductor substrate, a gate insulating layer formed on the semiconductor substrate, and a gate electrode formed on the gate insulating layer. The gate electrode has a multi-layered structure including a silicon-seed layer formed as a lowermost layer on the gate insulating layer, a polycrystalline silicon layer formed as an uppermost layer above the lowermost layer, and a silicon/germanium layer formed as an intermediate layer between the lowermost and uppermost layers. An average grain size of polycrystalline silicon in the uppermost layer is at most 100 nm. P-type impurities are substantially uniformly distributed in the gate electrode along a height thereof, and the germanium atoms are diffused from the intermediate layer into the lowermost layer at high density.

The lowermost, intermediate, and uppermost layers may be formed by using a chemical vapor deposition method, and the formation of the uppermost layer is carried out at a higher process temperature than a process temperature at which the lowermost and intermediate layers are formed.

Preferably, the p-type impurities are implanted in the gate electrode. In this case, the uniform distribution of the p-type impurities in the gate electrode and the diffusion of the germanium atoms from the intermediate layer into the lowermost are simultaneously achieved by annealing the semiconductor substrate at a higher process temperature than the process temperature at which the lowermost and intermediate layers are formed.

In accordance with another aspect of the present invention, there is provided a production process for manufacturing a semiconductor device including at least one p-channel type MOS transistor, which comprises the steps of preparing a semiconductor device, forming a gate insulating layer on the semiconductor substrate, and forming a gate electrode on the gate insulating layer. The gate electrode has a multi-layered structure including a silicon-seed layer formed as a lowermost layer on the gate insulating layer, a polycrystalline silicon layer formed as an uppermost layer above the lowermost layer, and a silicon/germanium layer formed as an intermediate layer between the lowermost and uppermost layers, and the formation of the uppermost layer being carried out at a higher process temperature than a process temperature at which the lowermost and intermediate layers are formed. The production process further comprises the steps of implanting p-type impurities in the gate electrode, and annealing the semiconductor substrate at a higher process temperature than the process temperature at which the uppermost layer is formed, such that the p-type impurities are substantially uniformly distributed in the gate electrode along a height thereof, and the germanium atoms are diffused from the intermediate layer into the lowermost layer at high density.

In this production process, the formation of the lowermost, intermediate, and uppermost layers may be carried out by using a chemical vapor deposition method.

When the chemical vapor deposition method is performed by a single-wafer type chemical vapor deposition apparatus, the formation of the lowermost and intermediate layers may be carried out at a process temperature falling a range between approximately 550° C. and approximately 650° C., and the formation of the uppermost layer may be carried out at a process temperature falling in a range between approximately 680° C. and approximately 800° C.

When the chemical vapor deposition method is performed by a batch-type chemical vapor deposition apparatus, the formation of the lowermost and intermediate layers may be carried out at a process temperature falling a range between approximately 450° C. and approximately 550° C., and the formation of the uppermost layer may be carried out at a process temperature falling in a range between approximately 600° C. and approximately 650° C.

Also, in the production process, both a p-type drain-formation region and a p-type source-formation region are defined in the semiconductor substrate while implanting the p-type impurities in the gate electrode, and the respective p-type drain-formation and p-type source-formation regions are produced as a drain region and a source region while annealing the semiconductor substrate at the higher process temperature than the process temperature at which the uppermost layer is formed.

The production process may further comprise the step of forming an insulating side wall around the gate electrode. In this case, the formation of the insulating side wall may be performed either prior to the annealing of the semiconductor substrate or after the annealing of the semiconductor substrate.

BRIEF DESCRIPTION OF THE DRAWINGS

The above objects and other objects will be more clearly understood from the description set forth below, with reference to the accompanying drawings, wherein:

FIG. 5A is a graph showing a density distribution of implanted boron ions and a density distribution of germanium atoms along the height of the three-layered gate electrode just after the implantation process for implanting the boron ions in the gate electrode is completed;

FIG. 5B is a graph showing a density distribution of implanted boron ions and a density distribution of germanium atoms along the height of the three-layered gate electrode just after the three-layered gate electrode is subjected to an annealing process; and FIG. 6 is a bar graph showing a drastic improvement in performance of the P-channel type MOS transistor according to the present invention.

DESCRIPTION OF THE PREFERRED EMBODIMENTS

Figure 1A:
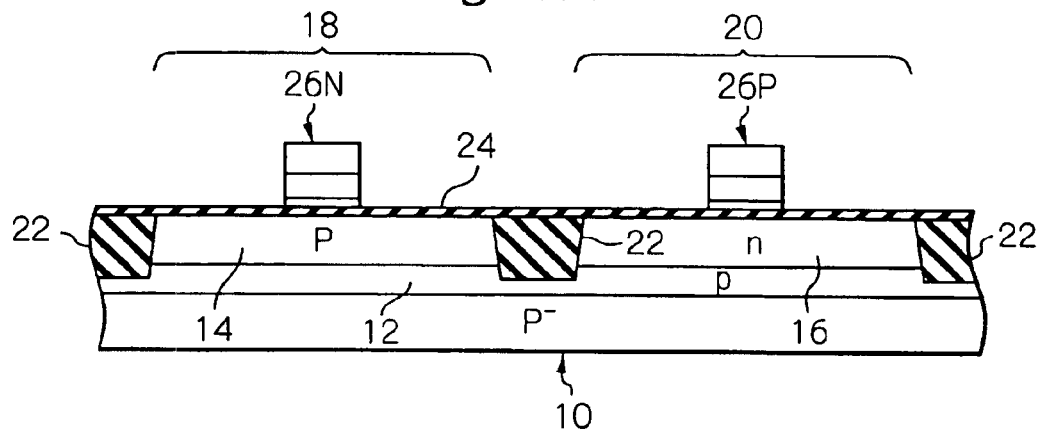
FIG. 1A is a partial cross-sectional view of a silicon substrate, showing a first representative step of a production process for manufacturing a complementary MOS device according to the present invention.

With reference to FIG. 1A, a representative step of a production process for manufacturing complementary MOS devices according to the present invention is illustrated.

In this drawing, reference 10 indicates, for example, a $p^-$-type monocrystalline silicon wafer, which is referred to as a $p^-$-type silicon substrate hereinafter. A p-type epitaxial layer 12 is formed on the $p^-$-type silicon substrate 10, and then plural sets of p-type well 14 and n-type well 16 are grown on the epitaxial layer 12 such that plural sets of n-channel type MOS transistor-formation area 18 and a p-channel type MOS transistor-formation area 20 are defined thereon. Note, in FIG. 1A, only a set of p-type well 14 and n-type well 16 is representatively illustrated.

Subsequently, an element-isolation layer 22 is formed in both the p-type well 14 and the n-type well 16 by using a well-known STI (Shallow Trench Isolation) method, such that the n-channel type MOS transistor-formation area 18 and the p-channel type MOS transistor-formation area 20 are surrounded and encompassed by the element-isolation layer 22, as shown in FIG. 1A. Then, a silicon dioxide layer 24, having a thickness of an order of 10 nm, is formed on the surface defined by the p-type well 14, the n-type well 16 and the element-isolation layer 22. Thereafter, a gate electrode 26N and a gate electrode 26P are formed on the silicon dioxide layer 24 so as to be substantially positioned at respective centers of the n-channel type and p-channel type MOS transistor-formation areas 18 and 20.

Note, as stated in detail hereinafter, each of the gate electrodes 26N and 26P has a multi-layered structure which is produced in accordance with the present invention, and an uppermost layer of the multi-layered structure is composed of polycrystalline silicon.

Figure 1B:
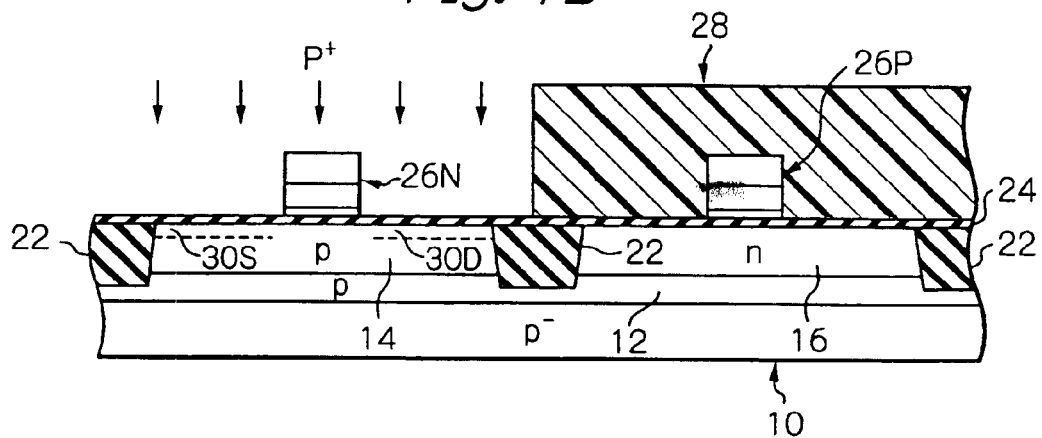
FIG. 1B is a partial cross-sectional view, similar to FIG. 1A, showing a second representative step of the production process according to the present invention.

After the formation of the gate electrodes 26N and 26P is completed, as shown in FIG. 1B, a photoresist layer 28 is formed on the silicon dioxide layer 24 having the gate electrodes 26N and 26P formed thereon, and is patterned by using a photolithography process and an etching process such that the n-channel type MOS transistor-formation area 18 is exposed to the outside. Then, n-type impurities, such as phosphorus ions ($P^+$) or the like, are implanted in the p-type well 14 of the n-channel type MOS transistor-formation area 18, as conceptually illustrated by arrows in FIG. 1B, so that phosphorus-ion-implanted regions 30S and 30D are formed in the p-type well 14 in a self-alignment manner due to the existence of the gate electrode 26N. In this embodiment, for example, the phosphorus-ion-implanted region 30S is defined as an n-type source-formation region, and the phosphorus-ion-implanted region 30D is defined as an n-type drain-formation region. Note, of course, the phosphorus ions ($P^+$) are also implanted in the gate electrode 26N of the n-channel type MOS transistor-formation area 18.

Figure 1C:
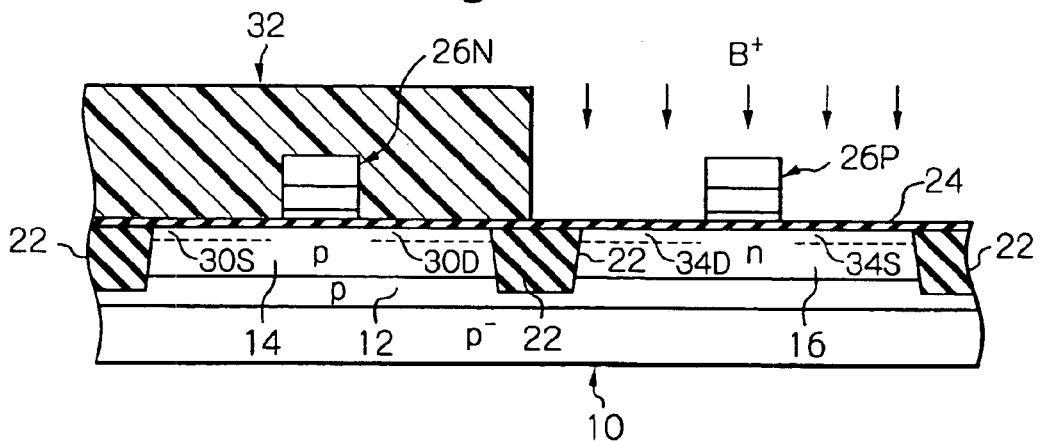
FIG. 1C is a partial cross-sectional view, similar to FIG. 1B, showing a third representative step of the production process according to the present invention.

After the formation of the n-type source-formation and n-type drain-formation regions 30S and 30D is completed, the photoresist layer 28 is removed from the silicon dioxide layer 24. Then, as shown in FIG. 1C, a photoresist layer 32 is again formed on the silicon dioxide layer 24 having the gate electrodes 26N and 26P formed thereon, and is patterned by using a photolithography process and an etching process such that the p-channel type MOS transistor-formation area 20 is exposed to the outside. Subsequently, p-type impurities, such as boron ions ($B^+$) or the like, are implanted in the n-type well 16 of the p-channel type MOS transistor-formation area 20, as conceptually illustrated by arrows in FIG. 1C, such that boron-ion-implanted regions 34D and 34S are formed in the n-type well 16 in a self-alignment manner due to the existence of the gate electrode 26P. In this embodiment, for example, the boron-ion-implanted region 34D is defined as a p-type drain-formation region, and the boron-ion-implanted region 34S is defined as a p-type source-formation region. Note, of course, the boron ions ($B^+$) are also implanted in the gate electrode 26P of the p-channel type MOS transistor-formation area 20.

Thereafter, an insulating layer, which is composed of a suitable insulating material, such as silicon dioxide, silicon nitride or the like, is formed on the surface of the silicon dioxide layer 24 having the gate electrodes 26N and 26P formed thereon, and is then subjected to an anisotropic etching process. In particular, in the anisotropic etching process, the insulating layer including the silicon dioxide layer 24 is etched back such that respective side walls 36N and 36P are formed along outer peripheral side faces of the gate electrodes 26N and 26P, as shown in FIG. 1D.

Figure 1D:
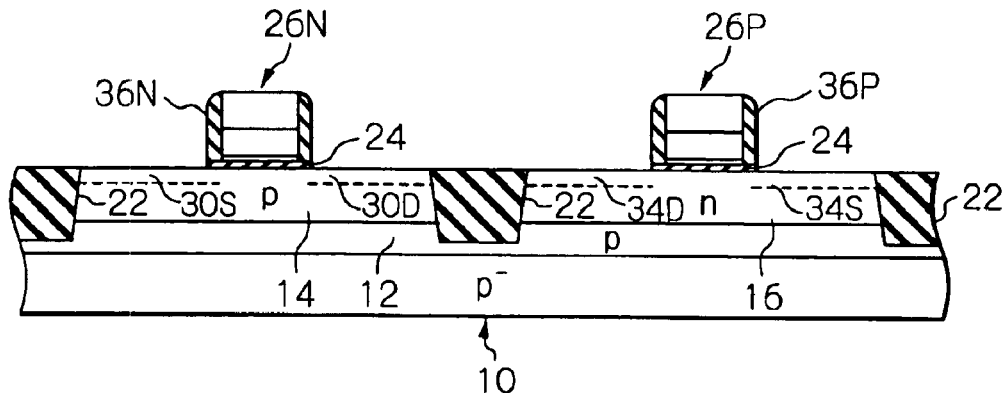
FIG. 1D is a partial cross-sectional view, similar to FIG. 1C, showing a fourth representative step of the production process according to the present invention.
Figure 1E:
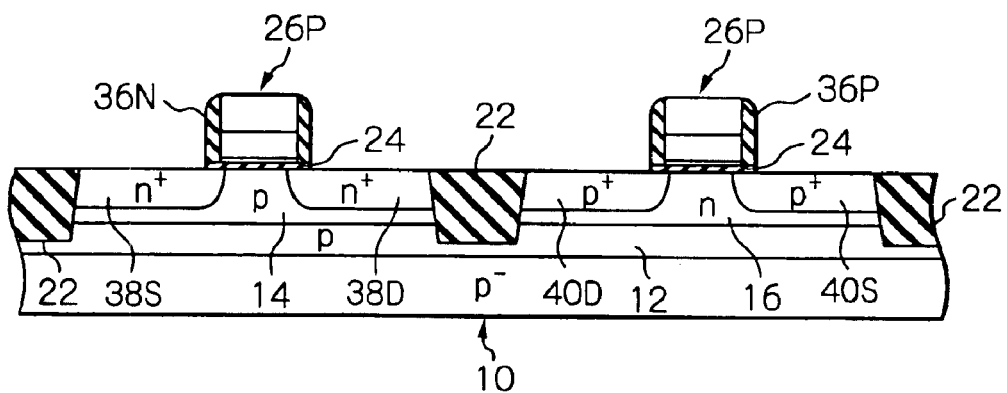
FIG. 1E is a partial cross-sectional view, similar to FIG. 1D, showing a fifth representative step of the production process according to the present invention.

After the formation of the side walls 36N and 36P is completed, the intermediate product shown in FIG. 1D is annealed at a temperature of more than 1,000° C. so that the phosphorus ions ($P^+$) implanted in the source-formation and drain-formation regions 30S and 30D and the boron ions ($B^+$) implanted in the drain-formation and source-formation regions 34D and 34S are activated, whereby the respective source-formation and drain-formation regions 30S and 30D are produced as an n-type source region 38S and an n-type drain region 38D in the p-type well 14, and whereby the respective source-formation and drain-formation regions 34D and 34S are produced as a p-type drain region 40D and a p-type source region 40S in the n-type well 14, as shown in FIG. 1E.

Figure 1F:
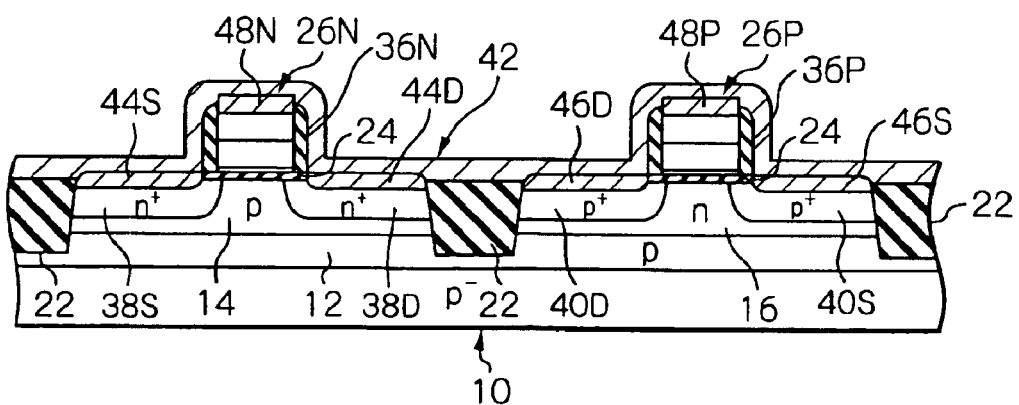
FIG. 1F is a partial cross-sectional view, similar to FIG. 1E, showing a sixth representative step of the production process according to the present invention.

After the annealing process is completed, as shown in FIG. 1F, a metal layer 42 is formed on the entire surface of the intermediate product by using a sputtering process. In this embodiment, although the metal layer 42 is composed of cobalt (Co), another suitable refractory metal material, such as titanium (Ti), nickel (Ni) or the like, may be used for the formation of the metal layer 42. Cobalt reacts with silicon at the interfaces between the cobalt metal layer 42 and the source and drain regions 38S and 38D of the p-type well 14, to thereby produce cobalt-silicide layers 44S and 44D. Similarly, cobalt-silicide layers 46D and 46S are produced at the interfaces between the cobalt metal layer 42 and the source and drain regions 40D and 40S of the n-type well 16. Further, cobalt-silicide layer 48N and 48P are produced at the interfaces between the cobalt metal layer 42 and the gate electrodes 26N and 26P. In short, the production of the cobalt-silicide layers 44S and 44D; 46D and 46S; and 48N and 48P is carried out by using a salicide (self-aligned silicide) method.

Figure 1G:
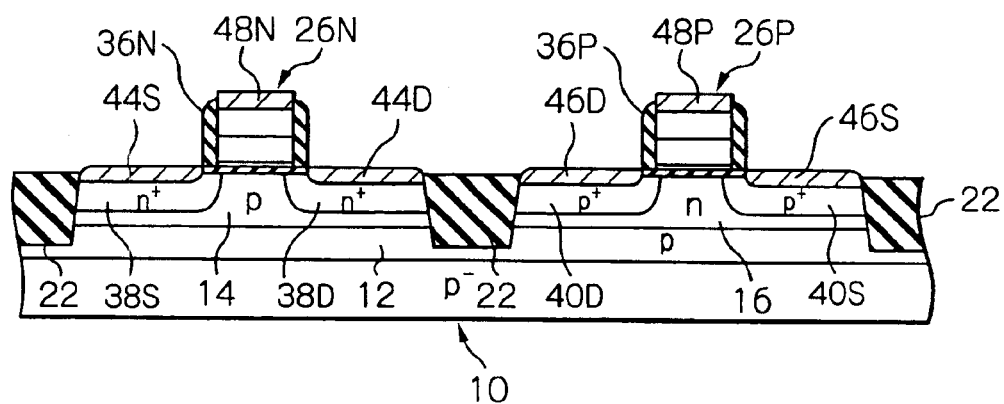
FIG. 1G is a partial cross-sectional view, similar to FIG. 1F, showing a seventh representative step of the production process according to the present invention.

After the production of the cobalt-silicide layers 44S and 44D; 46D and 46S; and 48N and 48P is completed, as shown in FIG. 1G, the cobalt metal layer 42 is removed from the surface of the intermediate product by an etching process such that the respective cobalt-silicide layers 44S and 44D; 46D and 46S; and 48N and 48P are left on the source and drain regions 38S and 38D; the drain and source regions 40D and 40S; and the gate electrodes 26N and 26P.

Figure 1H:
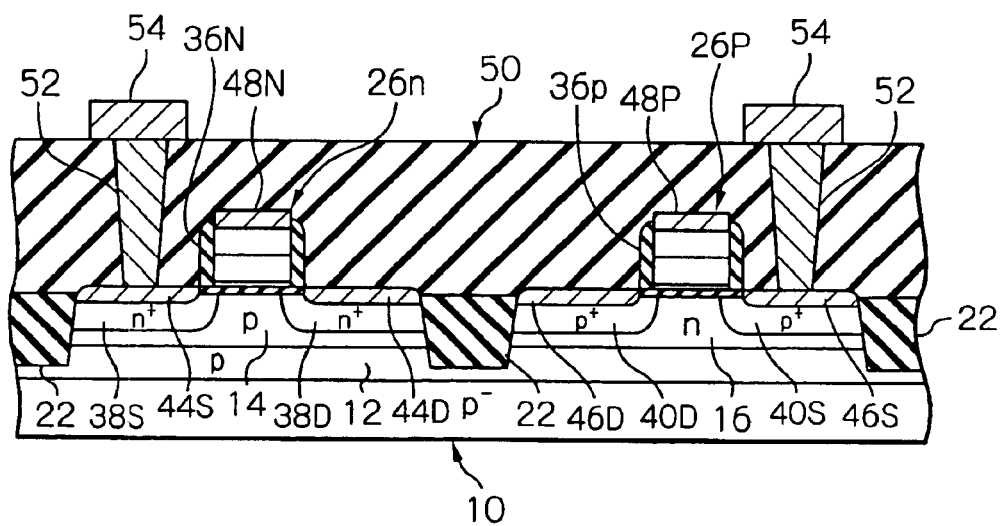
FIG. 1H is a partial cross-sectional view, similar to FIG. 1G, showing an eighth representative step of the production process according to the present invention.

Subsequently, as shown in FIG. 1H, an insulating interlayer 50, which may be composed of silicon dioxide or silicon nitride, is formed on the surface of the intermediate product by using a chemical vapor deposition (CVD) method. Then, respective contact holes are perforated in the insulating interlayer 50 by using a photolithography process and an etching process so as to reach the cobalt-silicide layers 44S and 46S, and then are filled with a suitable conductive material such as metal or the like, resulting in formation of through-holes 52. Although not illustrated in FIG. 1H, respective through-holes are simultaneously formed so as to reach the cobalt silicide layers 44D, 46D, 48N, and 48P. Thereafter, a wiring pattern is formed on the surface of the insulating interface 50 such that electrical connections are established between the wiring pattern and the through-holes (52), resulting in production of the complementary MOS devices.

Note, in FIG. 1H, reference 54 indicates respective pads which are in electrical contact with the through-holes 52, and which are included in the aforesaid wiring pattern.

Figure 2A:
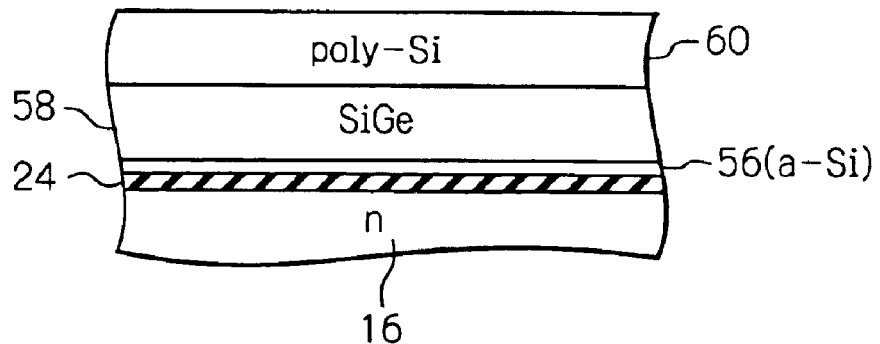
FIG. 2A is a partially-enlarged cross-sectional view of the silicon substrate of FIG. 1A, showing a first representative step of a gate-production process for producing three-layered gate electrodes on the silicon substrate according to the present invention.
Figure 2B:
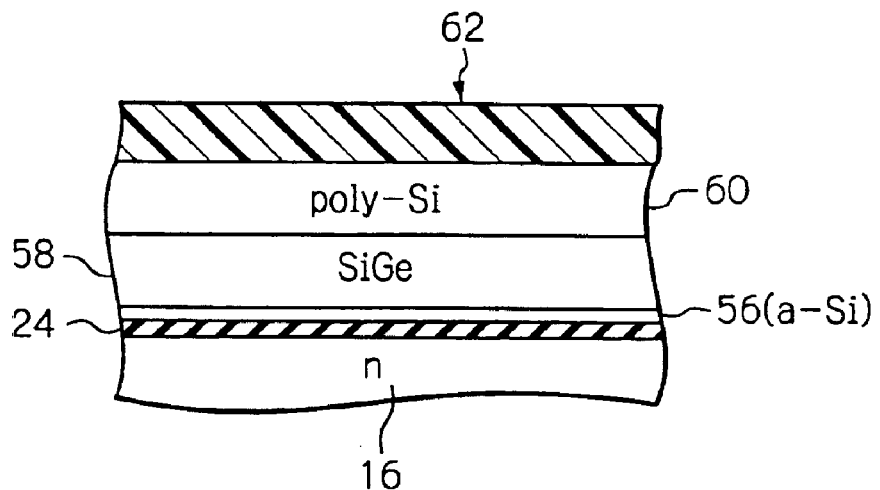
FIG. 2B is a partially-enlarged cross-sectional view, similar to FIG. 2A, showing a second representative step of the gate-production process for the three-layered gate electrode according to the present invention.
Figure 2C:
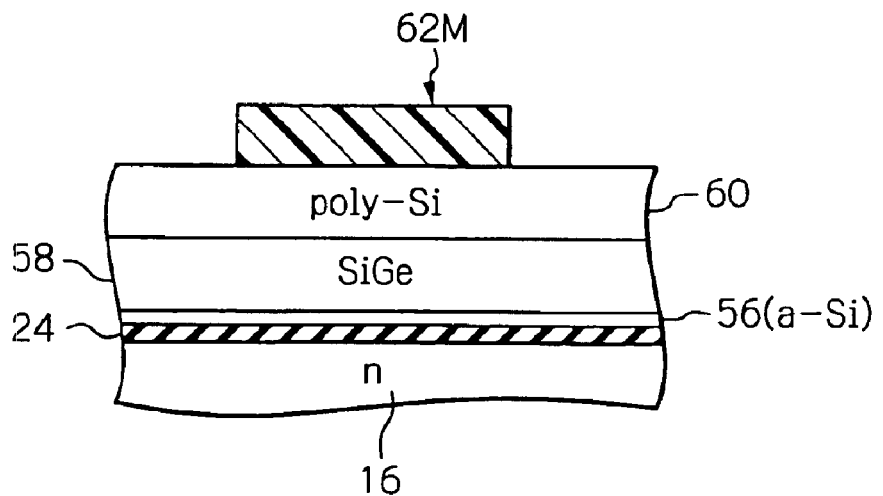
FIG. 2C is a partially-enlarged cross-sectional view, similar to FIG. 2B, showing a third representative step of the gate-production process for the three-layered gate electrode according to the present invention.

Next, referring to FIGS. 2A to 2C, the production of the gate electrode (26N, 26P) is explained.

As shown in FIG. 2A, first, a silicon-seed layer 56 having a thickness from approximately 3 nm to approximately 20 nm is formed on the silicon dioxide layer 24 by using a CVD method. In this embodiment, the silicon-seed layer 56 may be composed of either amorphous silicon or polycrystalline silicon. Namely, the silicon-seed layer 56 may be produced as an amorphous silicon layer when the process temperature therefor is relatively low, whereas the silicon-seed layer 56 may be produced as an polycrystalline silicon layer when the process temperature therefor is relatively high.

Then, a silicon/germanium (SiGe) layer 58 having a thickness from approximately 15 nm to approximately 50 nm is formed on the silicon-seed layer 56 by using a CVD method. The component ratio Si:Ge may be in a range of ratio 70 to 85:15 to 30. Subsequently, a cap-silicon layer 60 having a thickness from approximately 50 nm to approximately 100 nm is formed on the SiGe layer 58 by using a CVD method. The formation of the cap-silicon layer 60 is carried out at a higher temperature than a temperature at which both the silicon-seed layer 56 and the SiGe layer 58 are formed, and thus the cap-silicon layer 60 is formed as a polycrystalline silicon layer.

It should be avoided that the SiGe layer 58 is directly formed on the silicon dioxide layer 24 without the formation of the silicon-seed layer 56, because an adhesion between the silicon dioxide layer 24 and the SiGe layer 58 is poor. Namely, when silicon/germanium (SiGe) is directly deposited on the silicon dioxide layer 24, isolated SiGe grains are produced over the surface of the silicon dioxide layer 24, and thus it is impossible to uniformly deposit and form the SiGe layer 58.

It is possible to carry out the formation of the three layers 56, 58 and 60, using either a single-wafer type CVD apparatus and a batch-type CVD apparatus.

As well known, the single-wafer type CVD apparatus includes a first CVD chamber and a second CVD chamber, and processes a plurality of p$^-$-type silicon substrates or silicon wafers 10 one by one, to thereby form the three layers 56, 58 and 60 on the silicon dioxide layer 24 of each silicon wafer 10.

In particular, after a silicon wafer (10) is placed in the first CVD chamber having an interior temperature which falls in a range between approximately 550° C. and approximately 650° C., a silane gas ($SiH_4$ or $Si_2H_6$) is introduced into in the first CVD chamber, whereby the formation of the silicon-seed layer 56 on the silicon dioxide layer 24 of the silicon wafer 10 is started. After a lapse of enough time to form the silicon-seed layer 56 having the thickness of approximately 3 to approximately 20 nm, a germane ($GeH_4$) gas is additionally introduced into the first CVD chamber, whereby the formation of the SiGe layer 58 on the silicon-seed layer 56 is started.

After a lapse of enough time to form the SiGe layer 58 having the thickness of approximately 15 to approximately 50 nm, the silicon wafer 10 is transferred from the first CVD chamber to the second CVD chamber having an interior temperature which falls in a range between approximately 680° C. and approximately 800° C., and a silane gas ($SiH_4$ or $Si_2H_6$) is introduced into in the first CVD chamber, whereby the formation of the cap-silicon layer or polycrystalline silicon layer 60 on the SiGe layer 58 is started. After a lapse of enough time to from the polycrystalline silicon layer 60 having the thickness of approximately 50 to approximately 100 nm, the introduction of the silane gas ($SiH_4$ or $Si_2H_6$) into the second CVD chamber is stopped, and the silicon wafer 10 is discharged from the second CVD chamber, resulting in the formation of the three layers 56, 58 and 60 on the silicon dioxide layer 24 of the silicon wafer 10.

By using a transmission electron microscope (TEM), in reality, the inventors observed the crystalline-grain configuration of the cap-silicon layer or polycrystalline silicon layer 60, and measured an average grain-size of the crystalline gains. As a result, under the aforesaid process temperature conditions (680 to 800° C.), it was found that the cap-silicon layer or polycrystalline silicon layer 60 features the average grain-size of at most 100 nm. In other words, the majority of the crystalline grains, included in the polycrystalline silicon layer 60, are smaller than 100 nm.

As well known, the batch-type CVD apparatus includes a single CVD chamber, and treats a plurality of p⁻-type silicon substrates or silicon wafers 10 simultaneously, to thereby form the three layers 56, 58 and 60 on the silicon dioxide layer 24 of each silicon wafer 10.

In particular, after the plurality of silicon wafers 10 are placed in the single CVD chamber having an interior temperature which falls in a range between approximately 450° C. and approximately 550° C., a silane gas ($SiH_4$ or $Si_2H_6$) is introduced into the single CVD chamber, whereby the formation of the respective silicon-seed layers 56 on the silicon dioxide layers 24 of the silicon wafers 10 is started. After a lapse of enough time to form the silicon-seed layers 56 having the thickness of approximately 3 to approximately 20 nm, a germane ($GeH_4$) gas is additionally introduced into the single CVD chamber, whereby the formation of the respective SiGe layers 58 on the silicon-seed layers 56 is started.

After a lapse of enough time to from the SiGe layers 58 having the thickness of approximately 15 to approximately 50 nm, the introduction of the silane ($SiH_4$ or $Si_2H_6$) gas and the germane ($GeH_4$) gas into the single CVD chamber is stopped, and then the interior temperature of the single CVD chamber is raised to a range between approximately 600° C. and approximately 650° C. Subsequently, only the silane ($SiH_4$ or $Si_2H_6$) gas is introduced into in the single CVD chamber, whereby the formation of the respective cap-silicon layers or polycrystalline silicon layers 60 on the SiGe layers 58 of the silicon wafers 10 is started. After a lapse of enough time to from the polycrystalline silicon layers 60 having the thickness of approximately 50 to approximately 100 nm, the introduction of the silane gas ($SiH_4$ or $Si_2H_6$) into the single CVD chamber is stopped, and the silicon wafers 10 are discharged from the single CVD chamber, resulting in the formation of the three layers 56, 58 and 60 on the silicon dioxide layers 24 of the silicon wafers 10.

Similar to the above-mentioned case, by using the transmission electron microscope (TEM), in reality, the inventors observed the crystalline-grain configuration of the cap-silicon layer or polycrystalline silicon layer 60 obtained by the batch-type CVD apparatus, and measured an average grain-size of the crystalline gains. As the result, under the aforesaid process temperature conditions (600 to 650° C.), it was found that the cap-silicon layer or polycrystalline silicon layer 60 features the average grain-size of at most 100 nm. Namely, the majority of the crystalline grains, included in the polycrystalline silicon layer 60, are smaller than 100 nm.

Note, in either case, during the formation of the cap-silicon layer 60, polycrystallization of silicon may be caused in the silicon-seed layer 56 and the SiGe layer 58, due to the process temperature (680 to 800° C. or 600 to 650° C.) for the formation of the cap-silicon layer 60, which is higher than the temperature (550 to 650° C. or 450 to 550° C.) at which both the silicon-seed layer 56 and the SiGe layer 58 are formed.

Figure 2D:
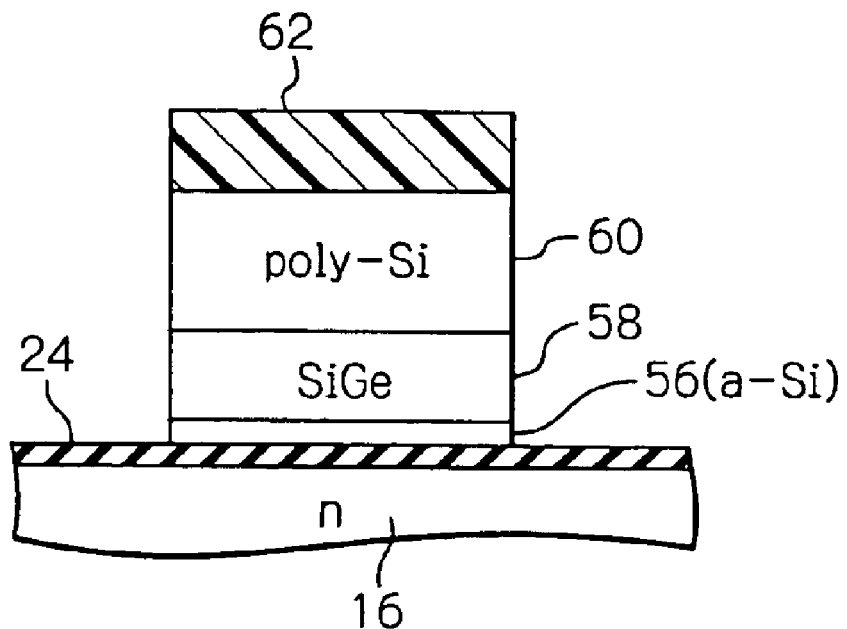
FIG. 2D is a partially-enlarged cross-sectional view, similar to FIG. 2C, showing a fourth representative step of the gate-production process for the three-layered gate electrode according to the present invention.

After the three layers 56, 58 and 60 are completely formed on the silicon dioxide layer 24 of the silicon wafer 10, a photoresist layer 62 is formed on the cap-silicon layer 60, as shown in FIG. 2B, and then is patterned by using a photolithography process and an etching process so that a photoresist mask pattern 62M for forming the gate electrodes (26N and 26P) is formed on the cap-silicon layer 60, as shown in FIG. 2C. Subsequently, the three layers 56, 58 and 60 are subjected to an etching process, using the photoresist layer mask pattern 62M, resulting in the production of the gate electrodes (26N, 26P) as representatively shown in FIG. 2D. Thereafter, as shown in FIG. 2E, the photoresist layer mask pattern 62M is removed from the cap-silicon layer 60, and this state corresponds to that of FIG. 1A.

Figure 2E:
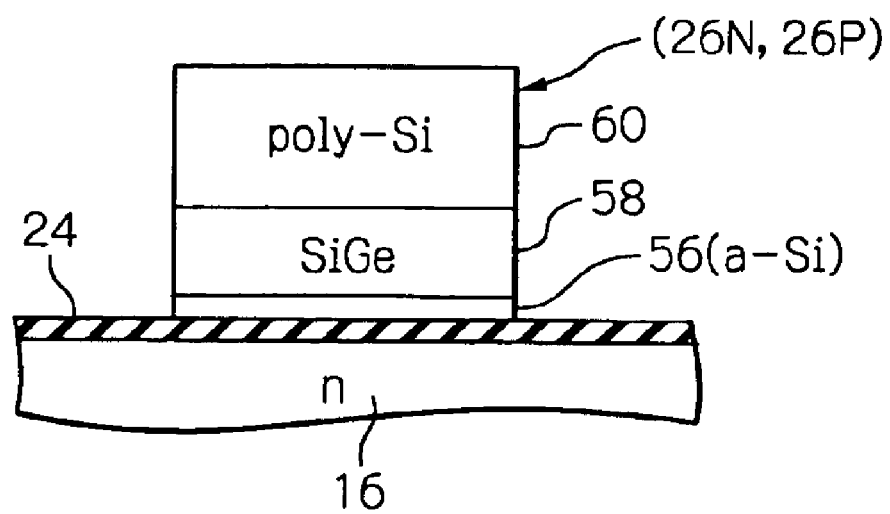
FIG. 2E is a partially-enlarged cross-sectional view, similar to FIG. 2D, showing a fifth representative step of the gate-production process for the three-layered gate electrode according to the present invention.

As is apparent from FIG. 2E, the gate electrode (26N, 26P) has the three-layered structure including the silicon-seed layer 56 formed as a lowermost layer on the silicon dioxide layer 24, the SiGe layer 58 formed as an intermediate layer on the lowermost layer 56, and the cap-silicon layer or polycrystalline silicon layer 60 formed as an uppermost layer on the intermediate layer 58.

The present invention aims at obtaining a desired constitution of the three-layered gate electrode 26P for the p-channel type transistor, and the three-layered gate electrode 26P must be subjected to two further processes before the desired constitution of the gate electrode 26P can be obtained. One of the further processes for obtaining the desired constitution of the gate electrode 26P is to implant p-type impurities, such as boron ions ($B^+$) or the like in the gate electrode 26P, and the other further process is to anneal the gate electrode 26P at a temperature of more than 1,000° C. to thereby diffuse the implanted boron ions ($B^+$) and the germanium atoms (Ge) of the intermediate layer 58 in the gate electrode 26P. However, in this embodiment, the aforesaid further processes were already explained with reference to FIGS. 1C and 1E.

In particular, as stated above, while the boron ions ($B^+$) are implanted in the n-type well 16 of the p-channel type MOS transistor-formation area 20 (FIG. 1C), the boron ions ($B^+$) are implanted in the gate electrode 26P. Namely, the implantation process for implanting the boron ions ($B^+$) in the gate electrode 26P is achieved by the step shown in FIG. 1C. Also, the intermediate product shown in FIG. 1D is annealed at the temperature of more than 1,000° C., to thereby produce the source and drain regions 38S and the drain and source regions 40D and 40S, as shown in FIG. 1E. Namely, the annealing process for diffusing the boron ions ($B^+$) and the germanium atoms (Ge) in the gate electrode 26P is achieved by the step shown in FIG. 1E.

In general, although it is considered that grain sizes of polycrystalline silicon become larger while being annealed at a temperature of more than 1,000° C., the grain sizes of polycrystalline silicon are not changed when being formed at the relatively high process temperature (680 to 800° C. in the single-wafer type CVD apparatus or 600 to 650° C. in the batch-type CVD apparatus). Namely, although the three-layered gate electrode 26P is subjected to the annealing process at the process temperature more than 1,000° C. (FIG. 1E), the average grain size of polycrystalline silicon in the cap-silicon layer or upper most layer 60 is maintained at at most 100 nm.

Figure 3A:
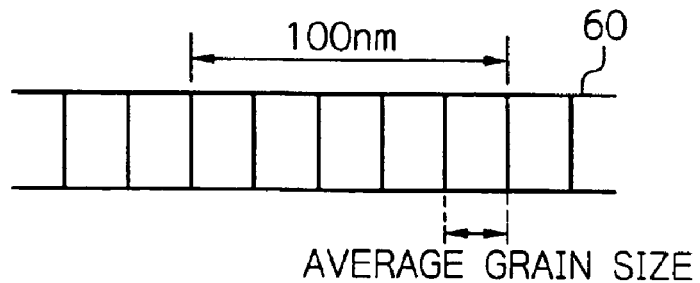
FIG. 3A is a cross-sectional view of an uppermost polycrystalline silicon layer of the three-layered gate electrode, conceptually illustrating a grain size of polycrystalline silicon obtained according to the present invention.

For example, as conceptually shown in FIG. 3A, when an average grain size of the cap-silicon layer 60 is 20 nm, this average grain size of 20 nm is still maintained after the gate electrode 26P having the thickness from 50 nm to 100 nm is subjected to the annealing process at the process temperature of more than 1,000° C. However, if the formation of the cap-silicon layer 60 is carried out at the relatively low process temperature (550 to 650° C. in the single-wafer type CVD apparatus or 450 to 550° C. in the batch-type CVD apparatus) at which both the silicon-seed layer 56 and the SiGe layer 68 are formed, as disclosed in the above-mentioned JP-A-2002-305256, this average grain size of 20 nm may become more than 100 nm, as conceptually shown in FIG. 3B.

Figure 3B:
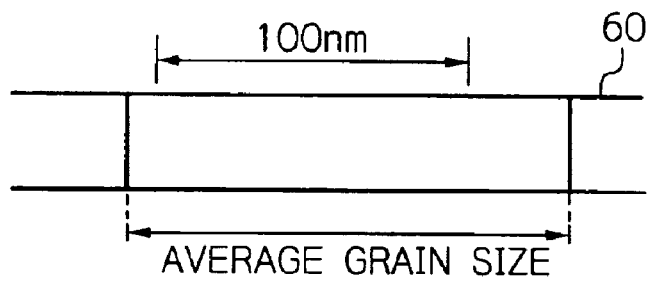
FIG. 3B is a cross-sectional view of an uppermost polycrystalline silicon layer of the three-layered gate electrode, conceptually illustrating a grain size of polycrystalline silicon obtained according to the conventional method.

As indicated in FIG. 3A, if the gate electrode 26P has a dimension of 100 nm along the gate length, the cap-silicon layer or uppermost layer 60 of the gate electrode 26P is composed of polycrystalline silicon having the average grain size of 20 nm. On the other hand, when the formation of the cap-silicon layer 60 is carried out at the relatively low process temperature (JP-A-2002-305256), the cap-silicon layer or uppermost layer 60 of the gate electrode 26P may be composed of monocrystalline silicon having the average grain size of more than 100 nm, as shown in FIG. 3B.

Figure 4:
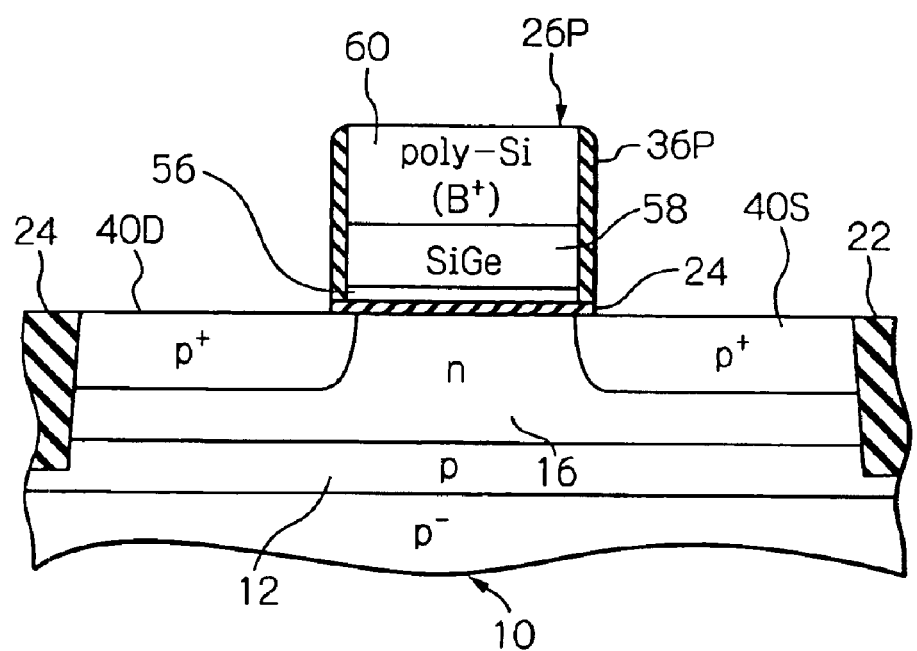
FIG. 4 is a partially-enlarged view of FIG. 1E, showing the three-layered gate electrode for a p-channel type MOS transistor, with boron ions implanted in the gate electrode being represented by "($B^+$)" written in the uppermost polycrystalline silicon layer thereof.

With reference to FIG. 4, the three-layered gate electrode 26P shown in FIG. 1E is illustrated in a partially-enlarged view. As shown in this drawing, the implanted boron ions are represented by "(B+)", written in the uppermost layer 60.

According to the present invention, when the gate electrode 26P is subjected to the annealing process at the process temperature of more than 1,000° C., it is possible to uniformly diffuse the implanted boron ions (B+) in the gate electrode 26P along the height thereof, and it is possible to effectively diffuse the germanium atoms (Ge) from the SiGe silicon layer 58 into the very thin silicon-seed layer 56.

In particular, with reference to a graph of FIG. 5A, respective references "BD", and "GD" represent a density distribution of the implanted boron ions (B+) and a density distribution of the germanium atoms (Ge) along the height of the gate electrode 26P just after the implantation process for implanting the boron ions (B+) in the gate electrode 26P is completed (FIG. 1C). While the gate electrode 26P is annealed at the process temperature of more than 1,000° C. (FIG. 1E), the density distributions "BD" and "GD" are changed as shown in a graph of FIG. 5B. As is apparent from this graph, it is known that the implanted boron ions (B+) are uniformly diffused and distributed along the height of the three-layered gate electrode 26P, and that the germanium atoms (Ge) are diffused from the SiGe layer or intermediate layer 58 into the silicon-seed layer or lowermost layer 56 so that the density of germanium atoms (Ge) in the lowermost layer 56 is substantially equal to that of germanium atoms (Ge) in the SiGe layer or intermediate layer 58.

As well known, during the annealing process (FIG. 1E), the implanted boron ions (B+) are activated so as to occupy sites in the silicon lattice, to thereby create holes in the gate electrode 26P, but all the implanted boron ions (B+) are not activated by the annealing process. Namely, a ratio of the activated boron ions to all the implanted boron ions is defined as an activation ratio. Also, as well known, the activation ratio can be enhanced by the existence of the germanium atoms (Ge). Thus, with the desired constitution of the gate electrode 26P as shown in FIG. 5B, the activation ratio can be considerably enhanced in the vicinity of the interface between the silicon dioxide layer 24 and the silicon-seed layer or lowermost layer 56, it is possible to suppress creation of a depletion layer at the aforesaid interface between the silicon dioxide layer 24 and the silicon-seed layer 56, resulting in a drastic improvement of performance of the P-channel type MOS transistor.

In order to ascertain the drastic improvement of performance of the P-channel type MOS transistor according to the present invention, tests were carried out by inventors. For the tests, in reality, two kinds of p-channel type MOS transistors were manufactured. A first kind of p-channel type MOS transistor was manufactured in substantially the same manner as mentioned above, except that a cap-silicon layer or uppermost layer (60) was formed at the same process temperature as both a silicon-seed layer or lowermost layer (56) and a SiGe layer or intermediate layer (58) was formed.

A second kind of p-channel type MOS transistor was manufactured in substantially the same manner as mentioned above, except that a cap-silicon layer or uppermost layer (60) was formed at a relative low process temperature so as to be produced as an amorphous silicon layer. Then, a magnitude of an ON-current, which flows between a drain region (40D) and a source region (40S) in the first kind of p-channel type MOS transistor, was measured. Similarly, a magnitude of an ON-current was measured in the second kind of p-channel type MOS transistor. Further, a magnitude of an ON-current was measured in the p-channel type MOS transistor according to the present invention.

With reference to a bar graph of FIG. 6, the test results are shown. As is apparent from this bar graph, the magnitude of the ON-current in the p-channel type MOS transistor according to the present invention is drastically larger in comparison with the first and second kinds of p-channel type MOS transistors.

In the above-mentioned embodiment, although the n-type source and drain regions 38S and 38D and the p-type drain and source regions 30D and 30S are produced in the silicon substrate 10, these regions may be produced in another semiconductor substrate, if necessary.

Also, in the above-mentioned embodiment, although the annealing process is carried out after the formation of the side walls 36N and 36P, the annealing process may be carried our prior to the formation of the side walls 36N and 36P, if necessary.

Finally, it will be understood by those skilled in the art that the foregoing description is of preferred embodiments of the device, and that various changes and modifications may be made to the present invention without departing from the spirit and scope thereof.

What is claimed is:

1. A production process for manufacturing a semiconductor device including at least one p-channel type MOS transistor, which process comprises:
preparing a semiconductor device;
forming a gate insulating layer on said semiconductor substrate;
forming a gate electrode on said gate insulating layer, said gate electrode having a multi-layered structure including a silicon-seed layer formed as a lowermost layer on said gate insulating layer, a polycrystalline silicon layer formed as an uppermost layer above said lowermost layer, and a silicon/germanium layer formed as an intermediate layer between said lowermost and uppermost layers, the formation of said uppermost layer being carried out at a higher process temperature than a process temperature at which said lowermost and intermediate layers are formed;
implanting p-type impurities in said gate electrode; and
annealing said semiconductor substrate at a higher process temperature than the process temperature at which said uppermost layer is formed, such that said p-type impurities are substantially uniformly distributed in said gate electrode along a height thereof, and the germanium atoms are diffused from said intermediate layer into said lowermost layer at high density.

2. A production process as set forth in claim 1, wherein the formation of said lowermost, intermediate, and uppermost layers is carried out by using a chemical vapor deposition method.

3. A production process as set forth in claim 2, wherein said chemical vapor deposition method is performed by a leaf-type chemical vapor deposition apparatus, the formation of said lowermost and intermediate layers is carried out at a process temperature falling a range between approximately 550° C. and approximately 650° C., and the formation of said uppermost layer is carried out at a process temperature falling in a range between approximately 680° C. and approximately 800° C.

4. A production process as set forth in claim 2, wherein said chemical vapor deposition method is performed by a batch-type chemical vapor deposition apparatus, the formation of said lowermost an intermediate layers is carried out at a process temperature falling a range between approximately 450° C. and approximately 550° C., and the formation of said uppermost layer is carried out at a process temperature falling in a range between approximately 600° C. and approximately 650° C.

5. A production process as set forth in claim 1, wherein both a p-type drain-formation region and a p-type source-formation region are defined in said semiconductor substrate while implanting said p-type impurities in said gate electrode, and the respective p-type drain-formation and p-type source-formation regions are produced as a drain region and a source region while annealing said semiconductor substrate at the higher process temperature than the process temperature at which said uppermost layer is formed.

6. A production process as set forth in claim 1, further comprising forming an insulating side wall around said gate electrode, wherein the formation of said insulating side wall is performed prior to the annealing of said semiconductor substrate.

7. A production process as set forth in claim 1, further comprising forming an insulating side wall around said gate electrode, wherein the formation of said insulating side wall is performed after the annealing of said semiconductor substrate.

* * * * *